(12) United States Patent
Drost et al.

(10) Patent No.: US 9,979,404 B1
(45) Date of Patent: May 22, 2018

(54) MULTI-PHASE AMPLITUDE AND PHASE MODULATION

(71) Applicant: Silicon Laboratories Inc., Austin, TX (US)

(72) Inventors: Brian G. Drost, Corvallis, OR (US); Aaron J. Caffee, Scappoose, OR (US); Alessandro Piovaccari, Austin, TX (US); Aslamali A. Rafi, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days. days.

(21) Appl. No.: 15/395,055

(22) Filed: Dec. 30, 2016

(51) Int. Cl.
*H03L 7/087* (2006.01)
*H03L 7/099* (2006.01)
*H03L 7/093* (2006.01)
*H04L 7/00* (2006.01)
*H04B 1/04* (2006.01)
*H04L 27/20* (2006.01)

(52) U.S. Cl.
CPC ............. *H03L 7/087* (2013.01); *H03L 7/093* (2013.01); *H03L 7/099* (2013.01); *H04B 1/04* (2013.01); *H04L 7/0016* (2013.01); *H04L 27/20* (2013.01)

(58) Field of Classification Search
CPC . H03L 7/093; H03L 7/07; H03L 27/20; H03L 7/002; H04B 1/04
USPC ......... 375/268, 280, 294–295, 297, 371–376
See application file for complete search history.

(56) References Cited

U.S. PATENT DOCUMENTS

| | | | | |
|---|---|---|---|---|
| 5,719,527 A * | 2/1998 | Bateman | ............... | H03F 1/0294 329/325 |
| 5,939,951 A * | 8/1999 | Bateman | .................. | H03C 1/06 329/308 |
| 6,201,452 B1* | 3/2001 | Dent | .................... | H04L 27/2071 330/10 |
| 6,285,251 B1* | 9/2001 | Dent | .................... | H02M 3/1582 330/124 R |
| 6,587,511 B2* | 7/2003 | Barak | .................... | H03F 1/0294 330/127 |
| 7,336,753 B2* | 2/2008 | Hasson | ................. | H03F 1/0294 327/127 |
| 7,911,272 B2* | 3/2011 | Sorrells | ................. | H03F 1/0294 330/107 |
| 8,933,831 B2 | 1/2015 | Oshima et al. | | |
| 2003/0078016 A1* | 4/2003 | Groe | ........................ | H04B 1/04 455/91 |

(Continued)

OTHER PUBLICATIONS

Darabi, H., "Radio Frequency Integrated Circuits and Systems," Cambridge University Press 2015, pp. 264-268.

(Continued)

*Primary Examiner* — Emmanuel Bayard
(74) *Attorney, Agent, or Firm* — Zagorin Cave LLP

(57) ABSTRACT

A technique that reduces or eliminates trading-off power amplifier efficiency and costly external filtering in amplitude and phase modulated sinusoidal signal generation uses multi-phase outphasing and a multi-phase switching mode power amplifier to generate the amplitude and phase modulated sinusoidal signals. The technique combines multiple clock phases with sinusoidally weighted circuits of the switching mode power amplifier to improve amplitude and phase modulated sinusoidal signal generation.

18 Claims, 7 Drawing Sheets

(56) References Cited

U.S. PATENT DOCUMENTS

| | | | | |
|---|---|---|---|---|
| 2003/0079161 | A1* | 4/2003 | Verboom | G11B 20/10009 714/42 |
| 2003/0203724 | A1* | 10/2003 | Luo | H03C 3/0958 455/147 |
| 2004/0052312 | A1* | 3/2004 | Matero | H04B 1/406 375/295 |
| 2009/0036064 | A1* | 2/2009 | Ravi | H03C 3/40 455/76 |
| 2009/0067541 | A1* | 3/2009 | Byun | H03F 1/0294 375/297 |
| 2009/0072898 | A1 | 3/2009 | Sorrells et al. | |
| 2009/0088091 | A1 | 4/2009 | Shen et al. | |
| 2010/0074367 | A1* | 3/2010 | Kim | H03F 1/0294 375/296 |
| 2012/0242383 | A1* | 9/2012 | Elad | H03L 7/06 327/156 |
| 2013/0343173 | A1* | 12/2013 | Ahmadi Mehr | H04B 1/0483 370/215 |
| 2014/0120854 | A1 | 5/2014 | Briffa et al. | |
| 2014/0177755 | A1 | 6/2014 | Lu et al. | |
| 2015/0381401 | A1* | 12/2015 | Butterfield | H03F 1/0205 375/295 |

OTHER PUBLICATIONS

Drost, B, "Time-Based Analog Signal Processing," Thesis submitted to Oregon State University, Jun. 3, 2011, 139 pages.

Park, M. and Perrott, M., "A Multiphase PWM RF Modulator Using a VCO-Based Opamp in 45nm CMOS," IEEE Radio Frequency Integrated Circuits Symposium, 2010, pp. 39-42.

Rafi, A., "Harmonic Rejection Mixers for Wideband Receivers," Dissertation, The University of Texas at Austin, May 2013, 138 pages.

Ravi, A. et al., "A 2.4-GHz 20-40-MHz Channel WLAN Digital Outphasing Transmitter Utilizing a Delay-Based Widebrand Phase Modulator in 32-nm CMOS," IEEE Journal of Solid-State Circuits, vol. 47, No. 12, Dec. 2012, pp. 3184-3196.

Razavi, B., "RF Microelectronics," Pearson Education, Inc., 2012, pp. 751-832.

Tai, W. et al., "A Transformer-Combined 31.5 dBm Outphasing Power Amplifier in 45 nm LP CMOS With Dynamic Power Control for Back-Off Power Efficiency Enhancement," IEEE Journal of Solid-State Circuits, vol. 41, No. 7, Jul. 2012, pp. 1646-1658.

Walling, J. et al., "Digital Power Amplifier: A New Way to Exploit the Switched-Capacitor Circuit," IEEE Communications Magazine, Apr. 2012, pp. 145-151.

Xu, H. et al., "A Flip-Chip-Packaged 25.3 dBm Class-D Outphasing Power Amplifier in 32 nm CMOS for WLAN Application," IEEE Journal of Solid-State Circuits, vol. 46, No. 7, Jul. 2011, pp. 1596-1605.

Yoo, S. et al., "A Power-Combined Switched-Capacitor Power Amplifier in 90nm CMOS," IEEE Radio Frequency Integrated Circuits Symposium (RFIC), 2011, 4 pages.

* cited by examiner

MULTI-PHASE AMPLITUDE AND PHASE MODULATION

BACKGROUND

Field of the Invention

This application relates to circuits for signal communications.

Description of the Related Art

Referring to FIG. 1, a conventional direct-conversion (i.e., homodyne or zero-IF) transmitter architecture applies digital baseband data to separate in-phase (I) and quadrature (Q) digital-to-analog converters 102. Low-pass filters 106 attenuate spectral content beyond the bandwidth of the target transmission channel. Separate mixers 110 change the frequency of the filtered in-phase and quadrature analog signals to a radio frequency signal using clock signals that are 90 degrees out of phase with each other. Summer 112 provides the sum of the radio frequency in-phase and quadrature signals to the input of power amplifier 116. Ideally, power amplifier 116 linearly amplifies the sum of the radio frequency signals and provides the amplified signal to a transmission line and/or antenna (not shown) for transmission. Target system performance requires that mixers 110, summer 112, and power amplifier 116 have linear signal response. Otherwise, nonlinearity in radio frequency signal transmission may cause spectral regrowth (QPSK), cause amplitude compression (QAM), and/or AM/PM conversion, which corrupt symbol constellations and reduce system performance (i.e. increase bit error rate). In addition, transmitter efficiency may affect battery life, which is critical to portable radio frequency applications.

Transmitter 100 includes a power amplifier to deliver the modulated signal with sufficient power to drive a target load (e.g., a 50 Ohm antenna). In general, switching mode power amplifiers (e.g., Class D and Class E power amplifiers) may include multiple adjoined switched capacitor power amplifier units, which are driven simultaneously into a resonant LC circuit for efficient transmission. However, since switching power amplifiers deliver power using switching circuits, the output signal includes harmonic content that must be filtered out before the signal reaches an antenna for transmission and pollutes the surrounding electromagnetic spectrum. In general, avoiding such pollution requires relatively expensive on and/or off-chip components (e.g. high Q inductors and capacitors, bandpass filters, notch filters, etc.). Thus, while conventional switching mode power amplifiers increase power efficiency, which may extend battery life in portable applications, conventional switching mode power amplifiers are associated with an increase in system cost. In contrast, linear power amplifiers (e.g., Class A and Class AB power amplifiers) generally reduce the use of expensive off-chip components and may result in a lower cost product, but consume more power than other power amplifiers, thus reducing battery life. Accordingly, improved signal generation techniques are desired.

SUMMARY OF EMBODIMENTS OF THE INVENTION

In at least one embodiment, a circuit includes a first phase-locked loop configured to generate a first multi-phase clock signal based on a first digital signal and a reference clock signal, a second phase-locked loop configured to generate a second multi-phase clock signal based on a second digital signal and the reference clock signal. The first digital signal and the second digital signal control a phase relationship between the first multi-phase clock signal and the second multi-phase clock signal to modulate an envelope and a phase of a radio frequency signal. The circuit may include a switching mode power amplifier configured to provide the radio frequency signal based on the first multi-phase clock signal and the second multi-phase clock signal. The first digital signal and the second digital signal may control a phase relationship between the first multi-phase clock signal and the second multi-phase clock signal to modulate an envelope and a phase of the radio frequency signal.

The first phase-locked loop may be configured to induce a first static phase offset error to adjust the first multi-phase clock signal and the second phase-locked loop may be configured to induce a second static phase offset error to adjust the second multi-phase clock signal. The first phase-locked loop may include a first digital-to-analog converter configured to generate a first analog offset signal based on the first digital signal, a first phase detector configured to generate a first error signal in response to the reference clock signal and a first feedback clock signal, a first summer configured to combine the first analog offset signal with the first error signal to generate a first combined error signal, a first loop filter configured to generate a first control signal based on the first combined error signal, and a first controllable oscillator configured to generate the first multi-phase clock signal based on the first control signal. The second phase-locked loop may include a second digital-to-analog converter configured to generate a second analog offset signal based on the second digital signal, a second phase detector configured to generate a second error signal in response to the reference clock signal and a second feedback clock signal, a second summer configured to combine the second analog offset signal with the second error signal to generate a second combined error signal, a second loop filter configured to generate a second control signal based on the second combined error signal, and a second controllable oscillator configured to generate the second multi-phase clock signal based on the second control signal. The first feedback signal may be a first phase of the first multi-phase clock signal. The second feedback signal may be a first phase of the second multi-phase clock signal.

The circuit may include a first multi-modulus divider configured to generate the first feedback signal based on a first phase of the first multi-phase clock signal and a third digital signal and a second multi-modulus divider configured to generate the second feedback signal based on a first phase of the second multi-phase clock signal and a fourth digital signal. The first phase-locked loop may include a first phase detector configured to generate a first error signal in response to the reference clock signal and a first feedback clock signal, a first loop filter configured to generate a first control signal based on the first error signal, a first controllable oscillator configured to generate the first multi-phase clock signal based on the first control signal, and a first digital-to-time converter in a first feedback loop of the first phase-locked loop. The first digital-to-time converter may generate the first feedback clock signal based on a first phase of the first multi-phase clock signal and the first digital signal. The second phase-locked loop may include a second phase detector configured to generate a second error signal in response to the reference clock signal and a second feedback clock signal, a second loop filter configured to generate a second control signal based on the second error signal, a second controllable oscillator configured to generate the second multi-phase clock signal based on the second control signal, and a second digital-to-time converter in a second feedback loop of the second phase-locked loop. The second digital-to-time converter may generate the second feedback clock signal based on a first phase of the second multi-phase clock signal and the second digital signal.

The switching mode power amplifier circuit may include a first plurality of differential circuit paths. Each differential circuit path of the first plurality of differential circuit paths may correspond to a first respective phase signal of the first multi-phase clock signal. The switching mode power amplifier circuit may include a second plurality of differential circuit paths. Each differential circuit path of the second plurality of differential circuit paths may correspond to a second respective phase signal of the second multi-phase clock signal. The first plurality of differential circuit paths may be configured to generate a first plurality of impulses of output current that are non-linearly weighted. The second plurality of differential circuit paths may be configured to generate a second plurality of impulses of output current that are non-linearly weighted. The first plurality of impulses of output current may be sinusoidally weighted. The second plurality of impulses of output current may be sinusoidally weighted. The circuit may include a multi-tap balun configured to generate first current pulses corresponding to the first multi-phase clock signal and second current pulses corresponding to the second multi-phase clock signal. Each of the first and second current pulses may include a corresponding plurality of sinusoidally-weighted pulses of current.

A method for radio frequency signal transmission includes generating a first multi-phase clock signal based on a reference clock signal and a first digital signal using a first feedback loop, generating a second multi-phase clock signal based on the reference clock signal and a second digital signal using a second feedback loop, and generating an amplitude and phase modulated radio frequency signal based on the first multi-phase clock signal and the second multi-phase clock signal. The method may include modulating an amplitude and a phase of the radio frequency signal by adjusting a phase relationship between the first multi-phase clock signal and the second multi-phase clock signal using the first digital signal and the second digital signal. Generating the first multi-phase clock signal may include inducing a first static offset error in the first feedback loop and generating the second multi-phase clock signal comprises inducing a second static offset error in the second feedback loop. Generating the amplitude and phase modulated radio frequency signal may include driving a plurality of circuits of a switching mode amplifier, each circuit of the plurality of circuits being driven by a first corresponding clock phase signal of the first multi-phase clock signal and a second corresponding clock phase signal of the second multi-phase clock signal. Generating the amplitude and phase modulated radio frequency signal may include generating a first plurality of non-linearly weighted impulses of output current and a second plurality of non-linearly weighted impulses of output current using the first multi-phase clock signal and the second multi-phase clock signal. The first plurality of non-linearly weighted impulses of output current may be sinusoidally weighted. The second plurality of non-linearly weighted impulses of output current may be sinusoidally weighted.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
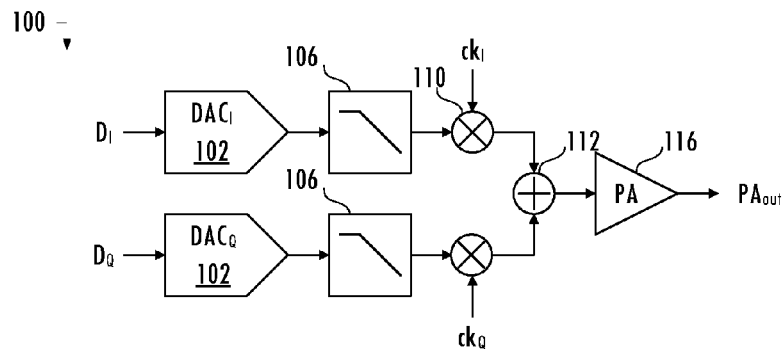
FIG. 1 illustrates a functional block diagram of a conventional direct conversion signal transmitter.

A technique for generating an amplitude and phase modulated sinusoidal signal for radio frequency transmission that reduces or eliminates trading-off power amplifier efficiency and costly external filtering uses multi-phase phase-locked loops and a multi-phase switching mode power amplifier. The technique combines multiple clock phases and sinusoidal signal weighting to improve accuracy of sinewave generation. For example, rather than apply uniform weights to signal components (e.g., weights of one that result in a power delivery sequence of 1, −1 (i.e. a square wave) for each clock cycle), a three-component solution uses weights of 0.5, 1, 0.5 to produce a power delivery sequence of 0.5, 1, 0.5, −0.5, −1, −0.5, i.e. a sequence that approximates a sinewave for each local oscillator clock cycle where the sampling frequency is six times the local oscillator frequency. Accordingly, the technique generates a power delivery sequence that is an improved estimate of a sinusoid with an increased sampling rate. Thus, under ideal conditions, the technique generates no local oscillator harmonics as a result of sharp filtering provided by sinusoidal weighting of the samples. Those harmonics that remain appear at higher frequencies, as the result of the sampled sinewave spectrum repeating at integer multiples of the sampling frequency (e.g., six times the frequency of the local oscillator), which relaxes a required transition width of an associated filter. The spectral purity of the switching power amplifier improves with an increase in the number of clock phases used, while power efficiency remains approximately constant. Although the technique increases die area with circuitry required for generating the multiple phases and taps in the combiner, that increased cost is substantially less than the cost of off-chip filter components that would otherwise be required. The technique may use outphasing for amplitude control. Rather than weighting transformer taps non-uniformly, non-uniform weightings of switched-capacitor circuits may be used. Increasing the number of taps further reduces harmonic content in the output sinusoid and further relaxes or eliminates external filtering requirements (i.e., further reduces costs).

A conventional power amplifier uses a multi-tap transformer to achieve high output power. By partitioning a primary winding of the transformer into multiple sections, the amplifier drives more power into a load (e.g., into an antenna), by combining the power delivered from each of the sections that may be limited by voltage headroom constraints (e.g. 1.2V). An outphasing technique linearly controls the output power of the power amplifier. Outphasing modulates the output signal amplitude and, hence, output power by controlling a phase difference between two phase modulated sinusoidal signals with constant envelopes. The technique converts the two phase modulated sinusoidal signals with constant envelopes to carrier frequency signals. A power amplifier amplifies and then combines those carrier frequency signals to generate an output amplitude and phase modulated radio frequency signal for transmission. For example, if both sinusoids have the same phase (i.e., phase difference of zero degrees) then the sinusoids add constructively to achieve the maximum output power transfer. If the sinusoids are 180 degrees out of phase, then the sinusoids perfectly cancel and the power amplifier transfers no power to the antenna. Any phase difference between the sinusoids between zero degrees and 180 degrees will cause a transmission of some output power in between the minimum output power (i.e., zero) and the maximum output power. A class D switching mode power amplifier improves power efficiency and scalability to future CMOS manufacturing processes. Because the power amplifier is a switching mode power amplifier, the phase difference between two differential clock waveforms (e.g., square waves) is controlled to achieve a target output amplitude signal that is applied to a transformer-based power combiner.

Figure 2:
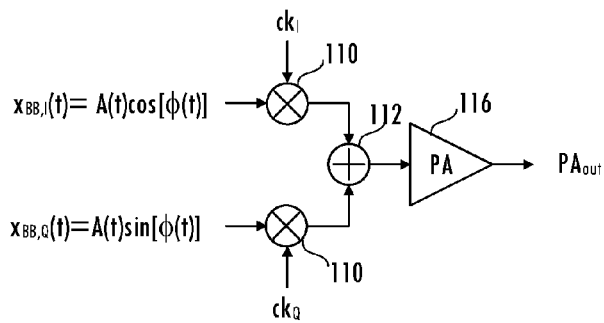
FIG. 2 illustrates a functional block diagram of a portion of the conventional direct conversion signal transmitter of FIG. 1 and associated baseband signals.

FIG. 2 illustrates conversion of the quadrature baseband signal components to an amplitude and phase modulated radio frequency signal. In general, the input signal to power amplifier 116 has a non-constant envelope (i.e., the peak-to-peak value varies), which increases the peak-to-average voltage ratio over which the power amplifier 116 must operate and is generally undesirable for linear power amplifier design. A constant envelope signal decreases the peak-to-average voltage ratio over which the power amplifier must operate, easing design of a linear power amplifier.

An outphasing system decomposes an input signal to the power amplifier, $V_{in}(t)$, which carries data using amplitude modulation and phase modulation, into two constant envelope signal components:

$$V_{in}(t) = V_{env}(t)\cos[\omega_0 t + \varphi(t)] = V_1(t) + V_2(t), \text{ where}$$

$$V_1(t) = \frac{V_0}{2}\sin[\omega_0 t + \varphi(t) + \theta(t)];$$

$$V_2(t) = -\frac{V_0}{2}\sin[\omega_0 t + \varphi(t) - \theta(t)]; \text{ and}$$

$$\theta(t) = \sin^{-1}\frac{V_{env}(t)}{V_0}.$$

Figure 3:
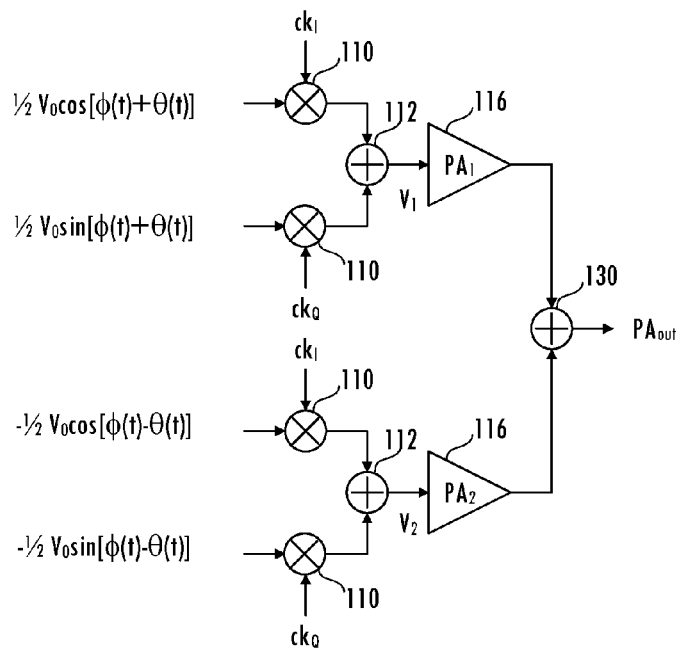
FIG. 3 illustrates a functional block diagram of a portion of an outphasing signal transmitter and associated baseband signals.

The constant envelope signals may be represented as:

$$V_1(t) = \frac{V_0}{2}\cos[\varphi(t) + \theta(t)]\sin\omega_0 t + \frac{V_0}{2}\sin[\varphi(t) + \theta(t)]\cos\omega_0 t; \text{ and}$$

$$V_2(t) = -\frac{V_0}{2}\cos[\varphi(t) - \theta(t)]\sin\omega_0 t - \frac{V_0}{2}\sin[\varphi(t) - \theta(t)]\cos\omega_0 t; \text{ and}$$

$$\theta(t) = \sin^{-1}\frac{V_{env}(t)}{V_0},$$

which may be implemented as illustrated by the outphasing transmitter of FIG. 3. The amplitude information of the signal is encoded in outphasing angle θ(t) between signal components $V_1(t)$ and $V_2(t)$. One or more stages (e.g., a switching mode power amplifier) amplifies or otherwise processes constant envelope, phase modulated signal components $V_1(t)$ and $V_2(t)$ and subsequent combination of the processed constant envelope, phase modulated signal components generates an output signal having the same envelope and phase information as $V_{in}(t)$, but greater output power.

Digital signals representing the phase modulation information may be computed digitally from baseband in-phase and quadrature data using a processor implementing digital signal processing techniques. The outphasing technique implements amplitude modulation at the outputs of power amplifiers 116. Accordingly, the outphasing technique may operate with nonlinear power amplifiers or may be used to relax power amplifier specifications. The outphasing technique drives two separate power amplifiers 116 with corresponding constant envelope, phase-modulated signals. Summer 130 combines the power amplifier output signals, which are phase displaced from one another. Driving each power amplifier 116 with a constant envelope, phase modulated signal improves the linearity of the power amplifier signal response and relaxes power amplifier design requirements. However, summer 130 can be lossy and the outphasing technique requires that summer 130 is linear in response to greater signal levels. In addition, the output impedance of each power amplifier 116 will change according to its output signal level, especially with a switching mode power amplifier. Thus, a complex, signal-dependent load causes nonlinearity in the outphasing transmitter of FIG. 3. In addition, the outphasing transmitter must address gain and phase mismatch that may cause spectral regrowth.

Figure 4:
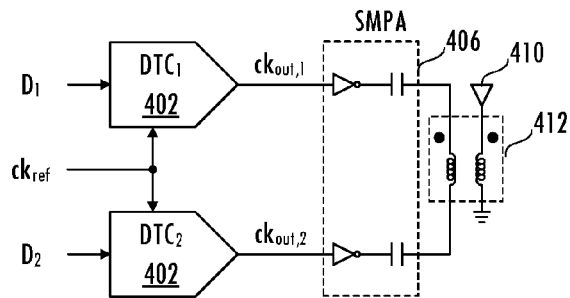
FIG. 4 illustrates a functional block diagram of a portion of an outphasing signal transmitter using digital-to-time conversion and a switching mode power amplifier.

Referring to FIG. 4, an outphasing transmitter includes a switching mode power amplifier 406 that provides a relatively constant impedance except during switching transitions and reduces loading dependencies, thus, improving linearity as compared to other power amplifiers. Digital signals $D_1$ and $D_2$ may be computed digitally from the baseband in-phase and quadrature signal using digital signal processor techniques (e.g., using up-sampling, CORDIC, etc.). Digital-to-time converters 402 apply digital signals $D_1$ and $D_2$ to directly modulate the radio frequency carrier (e.g., carrier clock signal $ck_{ref}$ having carrier frequency $f_{ref}$) and generate corresponding signal components having the carrier frequency $f_{ref}$. For example, increasing $D_1$ and $D_2$ by the same digital value causes the phase to move forward or backward and results in phase modulation of the carrier signal. Conversely, decreasing $D_1$ and increasing $D_2$ by the same amount only modulates the amplitude of the radiated radio frequency signal, which is a combination of two signals having the carrier frequency but with changed phase relationships. Unfortunately, any glitch that occurs in digital-to-time converters 402 due to changing $D_1$ and/or $D_2$ will cause transmission of unwanted energy. In addition, significant energy occurs at harmonics of carrier frequency $f_{ref}$. However, a differentially balanced design that couples to antenna 410 uses balun 412, rejects some even-order harmonic energy.

The baseband and quadrature signals are generated according to any digital modulation and output analog modulation techniques implemented by a target application. For example, to generate an amplitude modulated radio signal, digital signals $D_1$ and $D_2$ vary differentially across a predetermined range as determined by the desired modulation index, to produce an amplitude modulated radio frequency signal. The amplitude modulation corresponds to a sampled sequence of audio information. However, since a phase difference of two clock signals controls the envelope of the output radio frequency signal, the baseband data may be pre-distorted by an arc sine function (described above) to achieve a linear mapping from the baseband audio information to the envelope of the radio frequency signal. The resolution requirements of an associated digital-to-time converter is determined by the target signal quality for a particular application.

In another exemplary application, the output signal has a digital format. Digital signals $D_1$ and $D_2$ are determined based on the specified digital modulation technique (phase-shift keying, amplitude-shift keying, quadrature amplitude modulation). An exemplary phase-shift keying modulation technique varies the phase of the RF carrier between zero and 180 degrees. Thus, digital signals $D_1$ and $D_2$ vary in common to produce a common delay modulation (i.e. phase modulation) in the signal paths of the multi-phase clocks signals. To encode binary information in the carrier, a digital word applied to digital signals $D_1$ and $D_2$ generates two different values (corresponding to binary symbols "0" and "1" decoded at the receiver) that produce delays having a difference of half a period of the carrier signal (i.e. 180 degrees). Accordingly, the phase of the output signal encodes binary information and a minimum resolution required by an associated digital-to-time converter is one bit in common. In other applications, digital modulation techniques that encode more bits per symbol improve the transmission rate of information in bandwidth constrained applications (e.g., 64-QAM (quadrature amplitude modulation), which transmits six bits per symbol, or 256-QAM, which transmits eight bits per symbol) using digital signals $D_1$ and $D_2$, which vary differentially (i.e. amplitude modulation) across a 180 degree phase range and in common (i.e. phase modulation) across a 360 degree phase range. However, since amplitude modulation requires pre-distortion then an associated digital-to-time converter will require increased resolution to produce the analog signal with sufficient accuracy.

Figure 5:
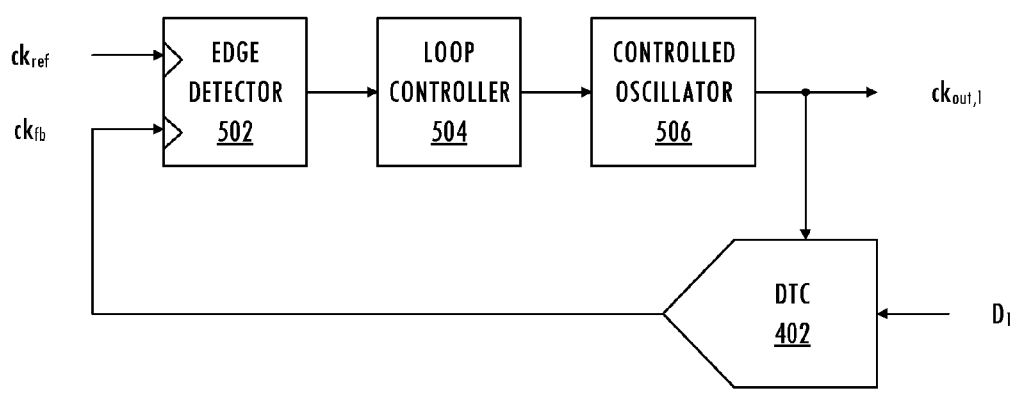
FIG. 5 illustrates a functional block diagram of a phase-locked loop including a digital-to-time converter in a feedback path configured as a digital-to-analog converter reconstruction filter.

A technique that addresses digital-to-analog converter glitches configures each digital-to-time converter 402 in a feedback path of a phase-locked loop, as illustrated in FIG. 5. Phase-locked loop 500 serves as a digital-to-analog converter reconstruction filter. Digital-to-time converter 402 inserts a delay in the feedback path of phase-locked loop 500. Edge detector 502 and loop controller 504 generate a control signal based on the error between carrier clock signal $ckr_{ref}$ and feedback clock signal $ck_{fb}$. That control signal drives controlled oscillator 506 to compensate for the delay inserted into output clock signal $ck_{out,1}$. However this technique does not address any harmonic content introduced by modulating a pair of clock signals.

Figure 6:
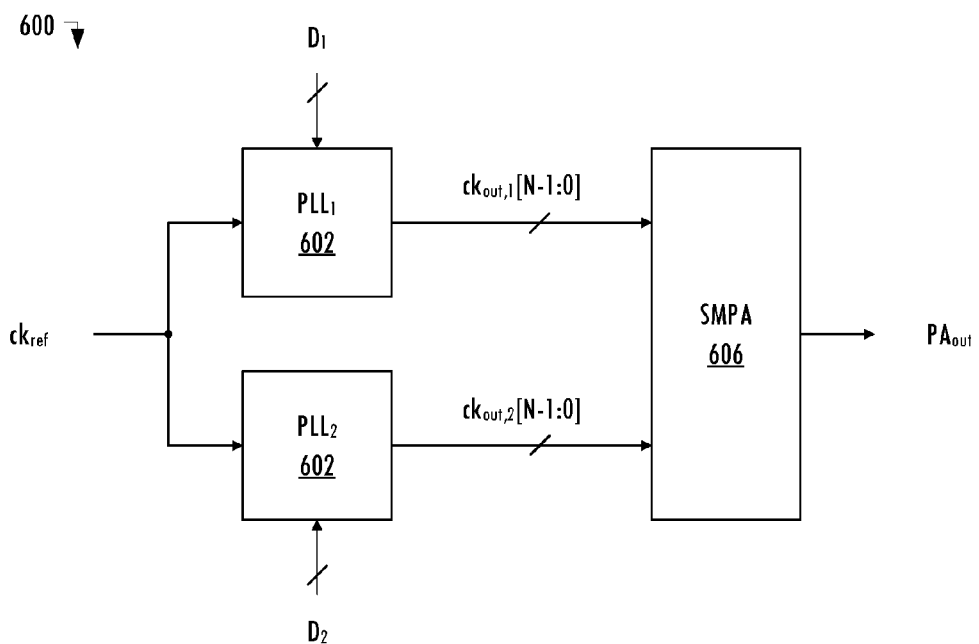
FIG. 6 illustrates a functional block diagram of a multi-phase signal generator using dual phase-locked loops consistent with at least one embodiment of the invention.

Referring to FIG. 6 a signal generation technique uses dual phase-locked loops to reduce unwanted energy at harmonics of the carrier frequency by increasing the number of transitions at the power amplifier output. Each phase-locked loop 602 modulates the phase of the carrier clock signal $ck_{ref}$ according to a corresponding digital value. Each phase-locked loop 602 generates a corresponding multi-phase clock signal $ck_{out,n}[N-1:0]$ that increases the transition density of signals used by switching mode power amplifier 606 to generate output signal $PA_{out}$. As referred to herein, a multi-phase clock signal is a plurality of clock signals including pulses with the same frequency and the same duty cycle. For example, the pulses of the plurality of clock signals are phase shifted from each other equally and span a full period. For example, a three phase clock signal includes three separate clock signals having pulses with the same frequency and duty cycle. A period of a first clock signal includes a first pulse occurring at 0 degrees, a period of a second clock signal includes a second pulse that is 120 degrees phase-shifted from the first pulse of the first clock signal, and a third clock signal includes a third pulse occurring at 240 degrees phase shifted from the first pulse of the first clock signal and 120 degrees phase shifted from the second pulse of the second clock signal. $PLL_1$ generates multi-phase clock signal $ck_{out,1}[N-1:0]$ using digital value $D_1$ and carrier clock signal $ck_{ref}$ having a carrier frequency. $PLL_2$ generates multi-phase clock signal $ck_{out,2}[N-1:0]$ using digital value $D_2$ and carrier clock signal $ck_{ref}$ having the carrier frequency $f_{ref}$. Switching mode power amplifier 606 includes separate circuits associated with each clock phase of the multi-phase clock signals. Nonlinearly weighting of the separate circuits associated with the multi-phase clock signals improves sinewave signal generation at the output and reduces harmonic content in output signal $PA_{out}$.

Figure 7:
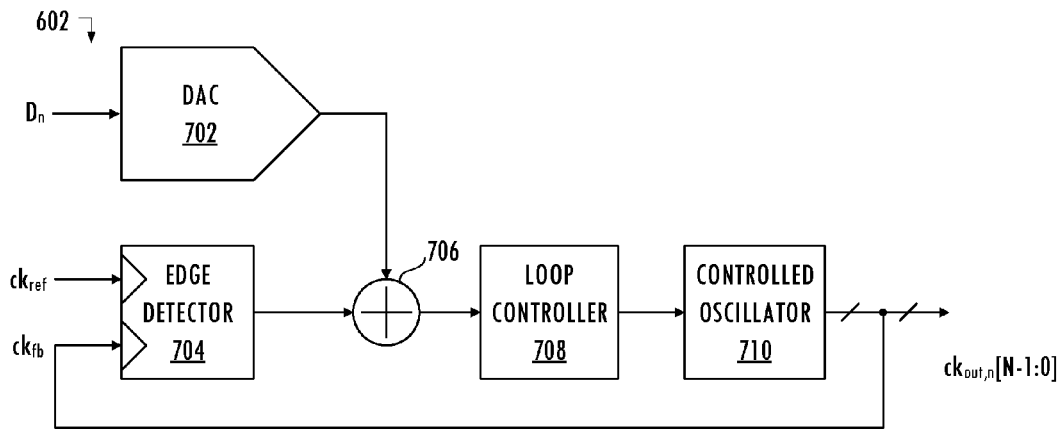
FIGS. 7-12 illustrate functional block diagrams of various embodiments of phase-locked loops 602 of the multi-phase signal generator of FIG. 6 consistent with various embodiments of the invention.
Figure 8:
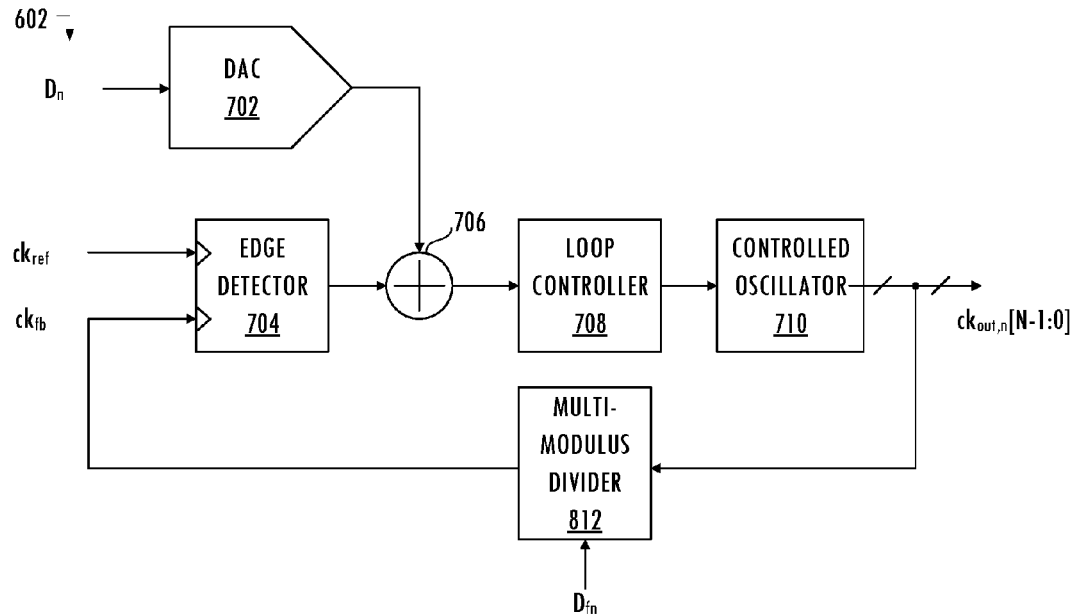

The multi-phase clock signals generated by each phase-locked loop 602 may be modulated by digital value $D_n$ using various techniques. For example, referring to FIG. 7, each phase-locked loop 602 may add an analog delay generated by digital-to-analog converter 702 corresponding to digital value $D_n$ (e.g., where index n equals '1' for $PLL_1$ or index n equals '2' for $PLL_2$) to the output of edge detector 704 using summing circuit 706 (e.g., a summing node). Loop controller 708 uses the output of summing circuit 702 to generate a control signal for controlled oscillator 710 based on the error between carrier clock signal $ckr_{ref}$ and feedback clock signal $ck_{fb}$. This technique introduces a static phase error that is reflected in the multi-phase clock signal $ck_{out,n}[N-1:0]$. The static phase offset causes phase-locked loop 602 to lock to an edge of clock signal $ck_{out,n}[N-1:0]$ that is offset from an edge of carrier clock signal $ck_{ref}$ to phase modulate the carrier signal. In at least one embodiment, controlled oscillator 710 is a ring oscillator, which intrinsically generates multiple, equally spaced clock phase signals. In other embodiments of phase-locked loop 602, the feedback path includes a clock divider (not shown), which causes phase-locked loop 602 to multiply clock signal $ck_{ref}$. Other embodiments of phase-locked loop 602 may be digital implementations that provide digital value $D_n$ directly to summing circuit 706, which may be an adder circuit instead of the summing node described above. Phase-locked loop 602 of FIG. 8 includes multi-modulus divider 812 in the feedback path to provide fractional frequency synthesis control according to digital value $D_{fn}$ for increased flexibility.

Figure 9:
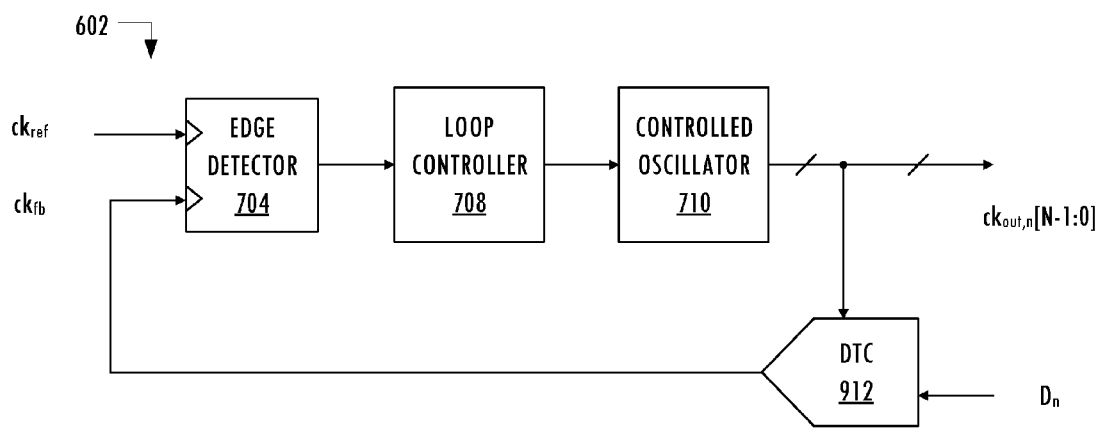
Figure 10:
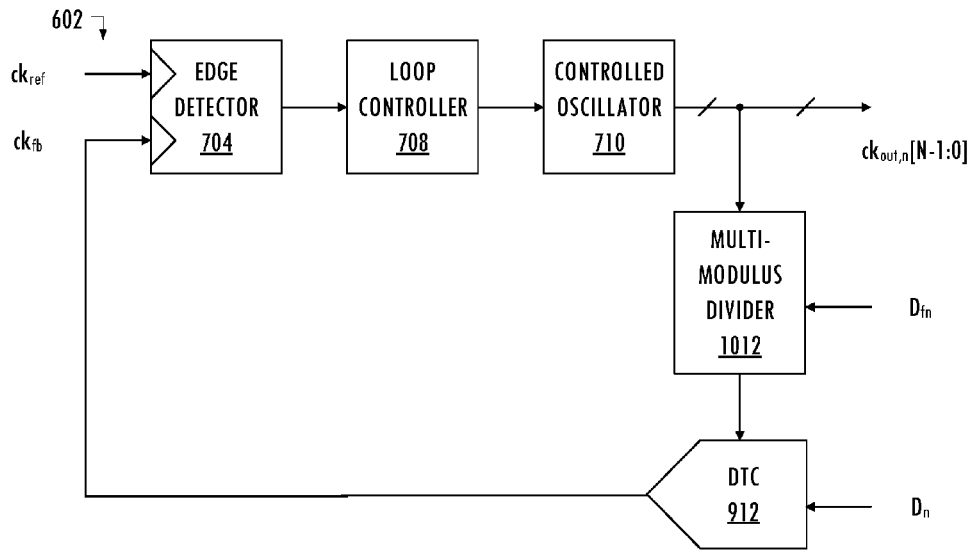
Figure 11:
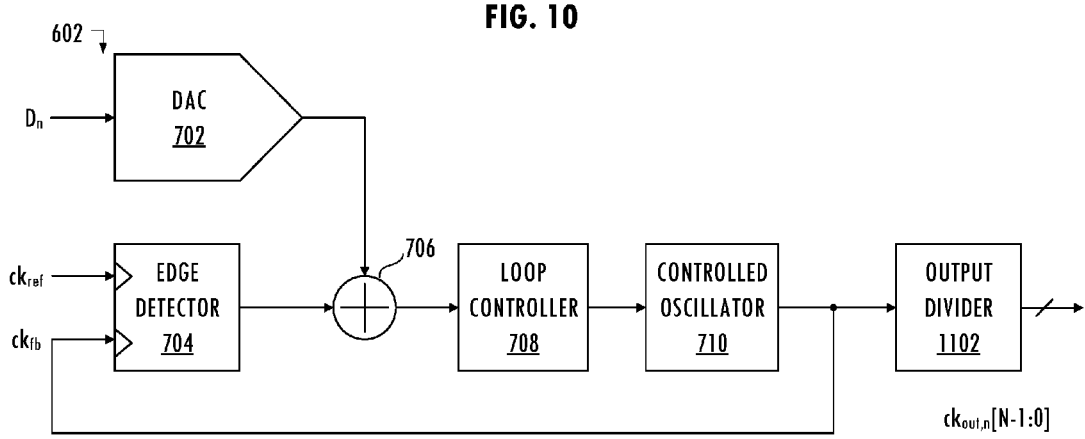
Figure 12:
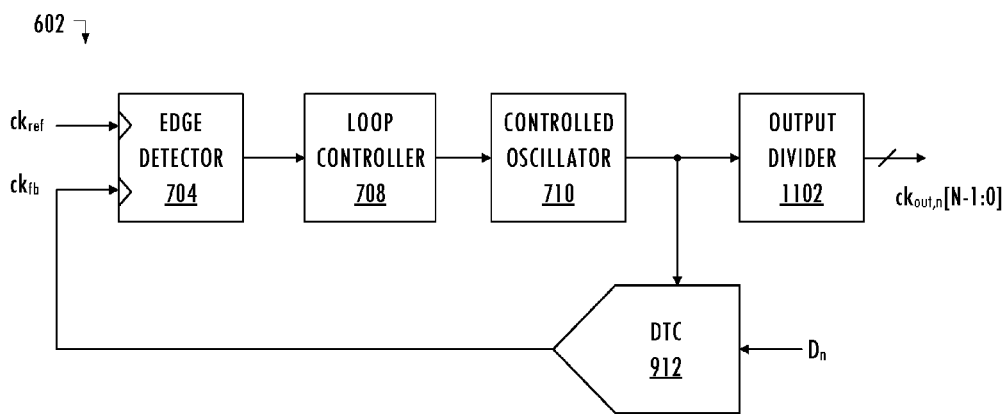

Referring to FIG. 9, rather than inducing a static phase error in the phase-locked loop, by configuring digital-to-time converter 912 in the feedback path of phase-locked loop 602, phase-locked loop 602 digitally controls the delay between the output of controlled oscillator 710 to the input of edge detector 704. Any changes in that delay causes phase-locked loop 602 to update the phase of multi-phase clock signal $ck_{out,n}[N-1:0]$ to maintain lock at the input of edge detector 704, thereby causing phase modulation of multi-phase clock signal $ck_{out,n}[N-1:0]$. FIG. 10 illustrates another embodiment of phase-locked loop 602, which includes digital-to-time converter 912 and multi-modulus divider 1012 in the feedback path to form an interpolative divider that provides fractional frequency synthesis control according to digital value $D_{fn}$ for increased flexibility. Referring to FIGS. 11 and 12, an alternative to using controlled oscillator 710 to produce multiple phases operates controlled oscillator 710 to generate a single phase clock at a higher frequency. Output clock divider 1102 generates multi-phase clock signal $ck_{out,n}[N-1:0]$ based on the single phase clock. This technique may be applied to any embodiment of phase-locked loop 602 described above.

Figure 13:
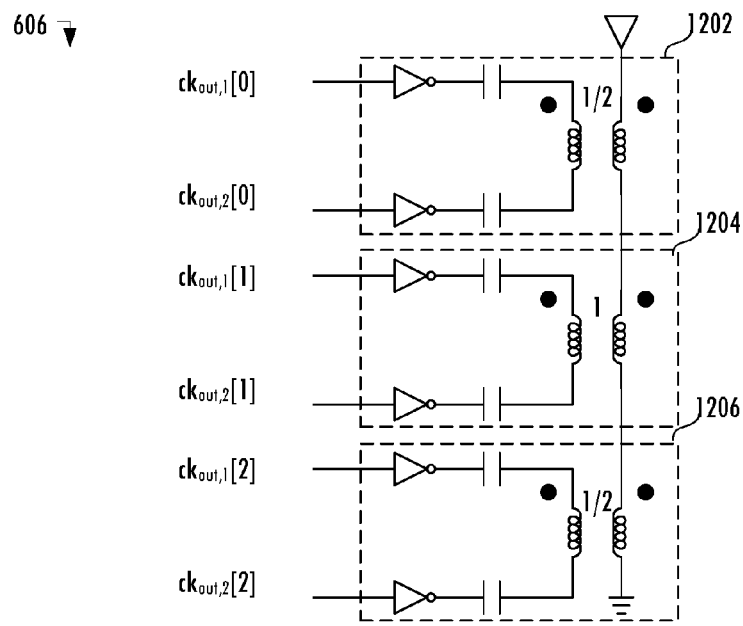
FIG. 13 illustrates a circuit diagram of a differential switching mode power amplifier consistent with at least one embodiment of the invention.
Figure 14:
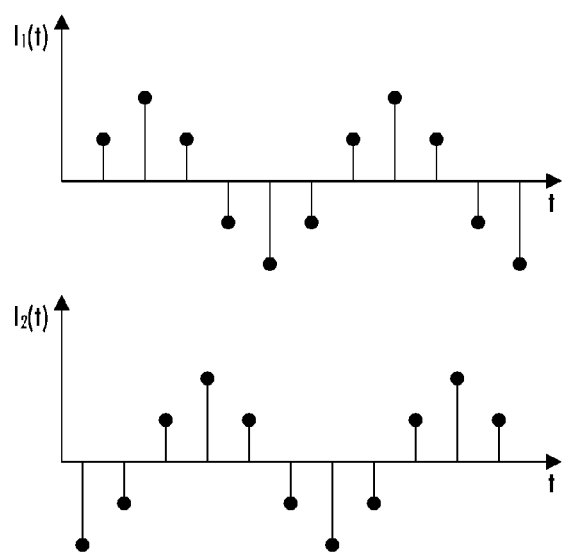
FIG. 14 illustrates waveforms for ideal current components generated by the switching mode power amplifier of FIG. 13 consistent with at least one embodiment of the invention.

Referring to FIGS. 6, 13, and 14, switching mode power amplifier 606 is configured to receive the two multi-phase clock signals from PLLs 602. Switching mode power amplifier 606 individually weights the strength that each individual clock phase signal contributes to the output power of switching mode power amplifier 606, which may be configured to drive an antenna. An exemplary embodiment of switching mode power amplifier 606 includes a transformer (e.g., a balun) with a primary winding having taps that divide the transformer into multiple sections. Each section of the transformer includes a differential circuit portion having equally-weighted switched capacitor circuits (e.g., inverters and capacitors in the differential paths of section 1202, section 1204, and section 1206 have equal circuit parameters). The switched-capacitor circuits may be equally weighted while section 1202, section 1204, and section 1206 have transformer section weightings of ½, 1, and ½, respectively, to generate pulses of output current that are weighted sinusoidally, thereby reducing harmonic content in the output signal. In at least one embodiment, the transformer is integrated with the switched-capacitor circuits on a single integrated circuit die. In other embodiments, the transformer is an external component and each section is coupled to two pads on an integrated circuit die including switching mode power amplifier 606.

In other embodiments of switching mode power amplifier 606, rather than weighting the sections of the transformer, the switched-capacitor circuits coupled to each section of the transformer have transfer functions that weight output signal components sinusoidally, thereby reducing harmonic content in the output signal. Still other embodiments of switching mode power amplifier 606 include a combination of weighted circuit portions and weighted sections of the transformer to generate pulses of output current that are weighted sinusoidally, thereby reducing harmonic content in the output signal. Multi-phase clock signal $ck_{out,1}[N-1:0]$ contributes impulses to $I_1(t)$ and multi-phase clock signal $ck_{out,2}[N-1:0]$ contributes impulses to $I_2(t)$. FIG. 14 illustrates ideal current impulses equally spaced in time. In practice, contributions of multi-phase clock signal $ck_{out,1}[N-1:0]$ and multi-phase clock signal $ck_{out,2}[N-1:0]$ are shaped by switching characteristics of the corresponding circuit portions and corresponding complex impedance loading. In addition, the actual current pulses are not equally spaced, but rather phase errors between each group of clock phases occur, e.g., due to delay mismatch in delay cells of a voltage-controlled oscillator of phase-locked loop 602. Those nonidealities may increase harmonic content of the output signal. However, nonidealities may be reduced using trimming techniques. Since the output current is a discrete time sinewave with six samples in each period, the spectrum will repeat every $6 \times f_{ref}$, which increases the frequency at which unwanted energy occurs facilitating improved filtering by the relatively narrowband power amplifier-antenna signal response.

Figure 15:
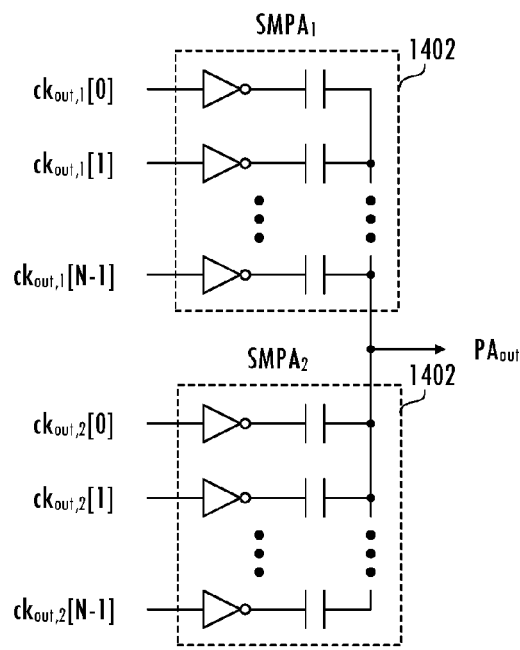
FIG. 15 illustrates a circuit diagram of a single-ended switching mode power amplifier consistent with at least one embodiment of the invention.

Referring to FIG. 15, multi-phase switching mode power amplifier 606 may include two separate multi-phase switching mode power amplifier units coupled in a single-ended configuration, which eliminates the need for the transformer of FIG. 13. Multi-phase clock signal $ck_{out,1}[N-1:0]$ and multi-phase clock signal $ck_{out,2}[N-1:0]$ are each coupled to a corresponding switching mode power amplifier unit 1402. Each switching mode power amplifier unit 1402 includes a separate circuit portion for each phase of the corresponding multi-phase clock signal. The circuit elements of each switching mode power amplifier unit 1402 are sized to generate output current that is weighted sinusoidally. Each switching mode power amplifier unit 1402 contributes an output current component that has a discrete time sinewave with six samples each period. A summing node combines the outputs of each multi-phase switching mode power amplifier 1402 to generate a single-ended version of output signal $PA_{out}$.

Figure 16:
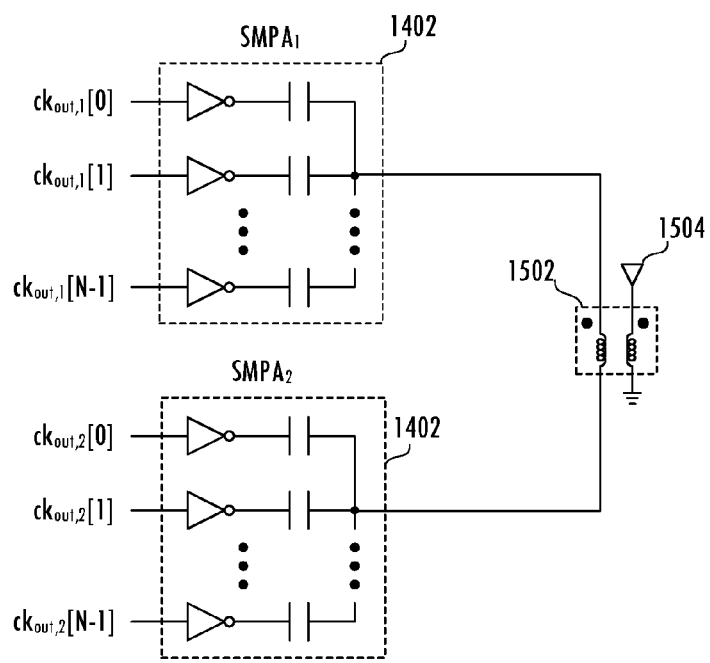
FIG. 16 illustrates a circuit diagram of a pair of multi-phase switching mode power amplifiers in a differential configuration consistent with at least one embodiment of the invention.

FIG. 16 illustrates multi-phase switching mode power amplifier 606 including two multi-phase switching mode power amplifier units 1402 configured to provide a differential output signal. Each multi-phase switching mode power amplifier unit 1402 includes a separate switched-capacitor circuit portion for each phase of a corresponding multi-phase clock signal. The switched-capacitor circuit portions of each power amplifier 1402 are weighted sinusoidally. Each switching mode power amplifier unit 1402 contributes an output current component that approximates a discrete time sinewave with six samples each period. Multi-phase switching mode power amplifiers 1402 provide a differential signal to balun 1502, which generates a single-ended signal that drives antenna 1504.

The number of clock signal phases and the number of sections of the transformer used above is exemplary only. Increased numbers of clock signal phases and increased numbers of sections of an associated transformer may be used. An increased number of clock signal phases improves linearity. However, the increased number of clock phase signals increases power consumption. Thus, the number of clock signal phases may be selected to improve linearity enough that off-chip components are not required to meet specifications for a target application. Improvements in linearity realized by switching mode power amplifier 606 are scalable with integrated circuit geometry. For example, as semiconductor manufacturing technology increases the speed of inverters, more clock phase signals may be used to generate an output current that is a discrete time sinewave with increased numbers of samples. Note that other switched capacitor circuit portions may include different circuit elements. For example, rather than use inverters in the multi-phase switching mode power amplifiers of FIGS. 13, 15, and 16, other switching circuits may be used (e.g., an analog multiplexer circuit coupled to receive high and low reference voltage levels. In addition, although an outphasing technique that uses phase-locked loops that generate multi-phase clocks has been described with respect to a homodyne transmitter circuit, other embodiments adapt the multi-phase outphasing technique for use in other applications (e.g., superheterodyne transmitter circuits, receiver circuits, or selectable bandwidth digital filters). Furthermore, although the multi-phase switching mode power amplifier techniques disclosed herein are described in embodiments implementing a multi-phase outphasing technique using phase-locked loops, the multi-phase switching mode power amplifier techniques may be adapted for use in other power amplifier and power combining applications.

Figure 17:
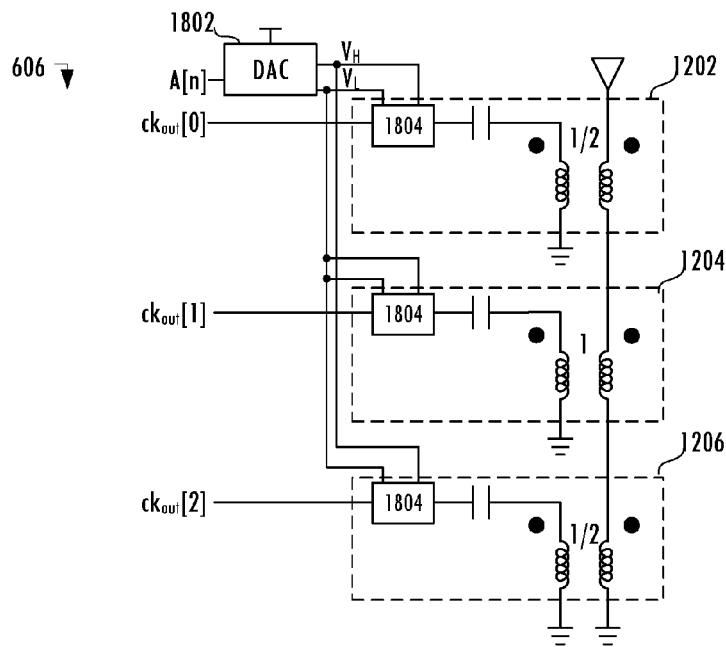
FIG. 17 illustrates a circuit diagram of a switching mode power amplifier including multiple transformer taps consistent with at least one embodiment of the invention.
Figure 18:
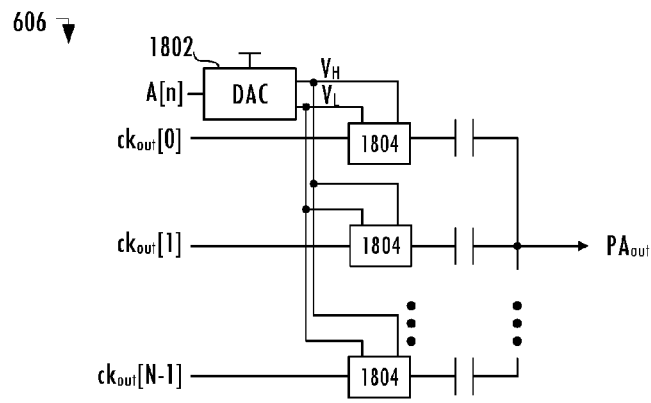
FIG. 18 illustrates a circuit diagram of a single-ended switching mode power amplifier consistent with at least one embodiment of the invention.
Figure 19:
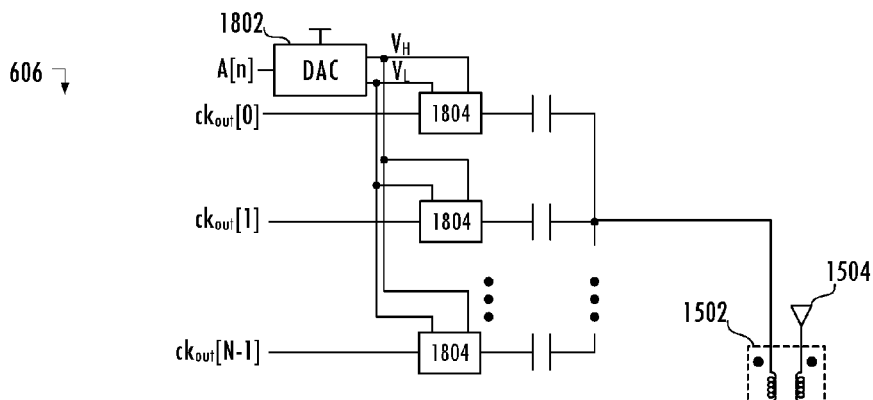
FIG. 19 illustrates a circuit diagram of a multi-phase switching mode power amplifier consistent with at least one embodiment of the invention.

In other embodiments, the multi-phase switching mode power amplifier is configured to synthesize an amplitude and phase modulated signal by using a single multi-phase phase-locked loop for phase modulation. Rather than using a second phase-locked loop and outphasing techniques for amplitude modulation as described above, power supply modulation of switching circuits in the multi-phase switching mode power amplifier achieve amplitude modulation of the output signal. For example, referring to FIGS. 17-19, a single phase-locked loop 602 (not shown) provides multi-phase clock signal $ck_{out}[n:0]$ to switched capacitor circuits of each multi-phase switching mode power amplifier 606. Digital-to-analog converter circuit 1802 converts digital amplitude modulation code A[n] to provide high power supply voltage level $V_H$ and low power supply voltage level $V_L$ to switching circuits 1804 (e.g., inverter circuit or analog multiplexer circuit), which select between high power supply voltage level $V_H$ and low power supply voltage level $V_L$ according to the corresponding clock phase signal to drive a corresponding load (e.g., a corresponding capacitor coupled to transformer section of FIG. 17, a corresponding capacitor coupled to a summing node of FIG. 18 or FIG. 19).

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein. In addition, the computer-readable media may store instructions as well as data that can be used to implement the invention. The instructions/data may be related to hardware, software, firmware or combinations thereof.

Thus, various embodiments of a technique for amplitude and phase modulated signal generation have been described. The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. A circuit comprising:
    a first phase-locked loop configured to generate a first multi-phase clock signal based on a first digital signal and a reference clock signal; and
    a second phase-locked loop configured to generate a second multi-phase clock signal based on a second digital signal and the reference clock signal; and
    a switching mode power amplifier configured to generate a radio frequency signal based on each clock signal of the first multi-phase clock signal and each clock signal of the second multi-phase clock signal,
    wherein the first digital signal and the second digital signal control a phase relationship between the first multi-phase clock signal and the second multi-phase clock signal to modulate an envelope and a phase of the radio frequency signal.

2. The circuit, as recited in claim 1, wherein the first phase-locked loop is configured to induce a first static phase offset error to adjust the first multi-phase clock signal and the second phase-locked loop is configured to induce a second static phase offset error to adjust the second multi-phase clock signal.

3. The circuit, as recited in claim 1,
    wherein the first phase-locked loop comprises:
        a first digital-to-analog converter configured to generate a first analog offset signal based on the first digital signal;
        a first phase detector configured to generate a first error signal in response to the reference clock signal and a first feedback clock signal;
        a first summer configured to combine the first analog offset signal with the first error signal to generate a first combined error signal;
        a first loop filter configured to generate a first control signal based on the first combined error signal; and
        a first controllable oscillator configured to generate the first multi-phase clock signal based on the first control signal, and
    wherein the second phase-locked loop comprises:
        a second digital-to-analog converter configured to generate a second analog offset signal based on the second digital signal;
        a second phase detector configured to generate a second error signal in response to the reference clock signal and a second feedback clock signal;
        a second summer configured to combine the second analog offset signal with the second error signal to generate a second combined error signal;
        a second loop filter configured to generate a second control signal based on the second combined error signal; and
        a second controllable oscillator configured to generate the second multi-phase clock signal based on the second control signal.

4. The circuit, as recited in claim 3,
    wherein the first feedback clock signal is a first phase of the first multi-phase clock signal, and
    wherein the second feedback clock signal is a first phase of the second multi-phase clock signal.

5. The circuit, as recited in claim 3,
wherein the first phase-locked loop further comprises a first multi-modulus divider configured to generate the first feedback clock signal based on a first clock signal of the first multi-phase clock signal and a third digital signal, and
wherein the second phase-locked loop further comprises a second multi-modulus divider configured to generate the second feedback clock signal based on a first clock signal of the second multi-phase clock signal and a fourth digital signal.

6. The circuit, as recited in claim 1,
wherein the first phase-locked loop comprises:
   a first phase detector configured to generate a first error signal in response to the reference clock signal and a first feedback clock signal;
   a first loop filter configured to generate a first control signal based on the first error signal;
   a first controllable oscillator configured to generate the first multi-phase clock signal based on the first control signal; and
   a first digital-to-time converter in a first feedback loop of the first phase-locked loop, wherein the first digital-to-time converter generates the first feedback clock signal based on a first clock signal of the first multi-phase clock signal and the first digital signal, and
wherein the second phase-locked loop comprises:
   a second phase detector configured to generate a second error signal in response to the reference clock signal and a second feedback clock signal;
   a second loop filter configured to generate a second control signal based on the second error signal;
   a second controllable oscillator configured to generate the second multi-phase clock signal based on the second control signal; and
   a second digital-to-time converter in a second feedback loop of the second phase-locked loop, wherein the second digital-to-time converter generates the second feedback clock signal based on a first clock signal of the second multi-phase clock signal and the second digital signal.

7. The circuit, as recited in claim 6, further comprising:
a first interpolative divider comprising:
   a first multi-modulus divider configured to generate a divided version of the first clock signal of the first multi-phase clock signal based on a third digital signal and the first clock signal of the first multi-phase clock signal; and
   the first digital-to-time converter configured to generate the first feedback clock signal based on the first digital signal and the divided version of the first clock signal of the first multi-phase clock signal; and
a second interpolative divider comprising:
   a second multi-modulus divider configured to generate a divided version of the first clock signal of the second multi-phase clock signal based on a fourth digital signal and the first clock signal of the second multi-phase clock signal; and
   the second digital-to-time converter configured to generate the second feedback clock signal based on the second digital signal and the divided version of the first clock signal of the second multi-phase clock signal.

8. The circuit, as recited in claim 1, wherein the switching mode power amplifier comprises:
   a first plurality of differential circuit paths, each differential circuit path of the first plurality of differential circuit paths corresponding to a first respective clock signal of the first multi-phase clock signal; and
   a second plurality of differential circuit paths, each differential circuit path of the second plurality of differential circuit paths corresponding to a second respective clock signal of the second multi-phase clock signal.

9. The circuit, as recited in claim 8,
wherein the first plurality of differential circuit paths is configured to generate a first plurality of impulses of output current that are sinusoidally weighted, and
wherein the second plurality of differential circuit paths is configured to generate a second plurality of impulses of output current that are sinusoidally weighted.

10. The circuit, as recited in claim 1, further comprising:
a multi-section transformer configured to generate first current pulses corresponding to the first multi-phase clock signal and second current pulses corresponding to the second multi-phase clock signal,
wherein each of the first and second current pulses comprises a corresponding plurality of sinusoidally-weighted pulses of current.

11. The circuit, as recited in claim 10,
wherein the first phase-locked loop comprises a first output divider configured to generate the first multi-phase clock signal based on a first output of a first controllable oscillator; and
wherein the second phase-locked loop comprises a second output divider configured to generate the second multi-phase clock signal based on a second output of a second controllable oscillator.

12. A method for radio frequency signal transmission comprising:
   generating a first multi-phase clock signal based on a reference clock signal and a first digital signal using a first feedback loop;
   generating a second multi-phase clock signal based on the reference clock signal and a second digital signal using a second feedback loop; and
   generating an amplitude and phase modulated radio frequency signal based on each clock signal of the first multi-phase clock signal and each clock signal of the second multi-phase clock signal,
wherein the first digital signal and the second digital signal control a phase relationship between the first multi-phase clock signal and the second multi-phase clock signal to modulate an envelope and a phase of the amplitude and phase modulated radio frequency signal.

13. The method, as recited in claim 12, wherein generating the first multi-phase clock signal comprises inducing a first static offset error in the first feedback loop and generating the second multi-phase clock signal comprises inducing a second static offset error in the second feedback loop.

14. The method, as recited in claim 12, wherein generating the amplitude and phase modulated radio frequency signal comprises driving a plurality of circuits of a switching mode amplifier, each circuit of the plurality of circuits being driven by a first corresponding clock signal of the first multi-phase clock signal and a second corresponding clock signal of the second multi-phase clock signal.

15. The method, as recited in claim 12, wherein generating the amplitude and phase modulated radio frequency signal comprises generating a first plurality of non-linearly weighted impulses of output current and a second plurality of non-linearly weighted impulses of output current using the first multi-phase clock signal and the second multi-phase clock signal.

16. The method, as recited in claim 15,
wherein the first plurality of non-linearly weighted impulses of output current are sinusoidally weighted, and
wherein the second plurality of non-linearly weighted impulses of output current are sinusoidally weighted.

17. An apparatus comprising:
means for generating a first multi-phase clock signal based on a reference clock signal, a first digital signal, and a first feedback signal;
means for generating a second multi-phase clock signal based on the reference clock signal, a second digital signal, and a second feedback signal; and
means for generating a radio frequency signal based on each clock signal of the first multi-phase clock signal and each clock signal of the second multi-phase clock signal,
wherein the first digital signal and the second digital signal control a phase relationship between the first multi-phase clock signal and the second multi-phase clock signal to modulate an envelope and a phase of the radio frequency signal.

18. The apparatus, as recited in claim 17, wherein an envelope and a phase of the radio frequency signal is modulated by adjusting a phase relationship between the first multi-phase clock signal and the second multi-phase clock signal using the first digital signal and the second digital signal.

* * * * *